(12) United States Patent
Qin et al.

(10) Patent No.: US 11,695,284 B1
(45) Date of Patent: Jul. 4, 2023

(54) SWITCH DETECTION CIRCUIT, METHOD, AND SWITCH DETECTOR

(71) Applicant: SHENZHEN POWEROAK NEWENER CO., LTD, Shenzhen (CN)

(72) Inventors: Geng Qin, Shenzhen (CN); Jianhua Lei, Shenzhen (CN); Qi Jiang, Shenzhen (CN); Hua Zhang, Shenzhen (CN); Xiangzhu Yin, Shenzhen (CN)

(73) Assignee: SHENZHEN POWEROAK NEWENER CO., LTD, Shenzhen (CN)

( * ) Notice: Subject to any disclaimer, the term of this patent is extended or adjusted under 35 U.S.C. 154(b) by 0 days.

(21) Appl. No.: 17/944,350

(22) Filed: Sep. 14, 2022

(30) Foreign Application Priority Data

Feb. 23, 2022 (CN) .......................... 202210165686.4

(51) Int. Cl.
*H02J 7/00* (2006.01)
*G01R 31/66* (2020.01)
(52) U.S. Cl.
CPC .......... *H02J 7/0032* (2013.01); *H02J 7/0047* (2013.01); *H02J 7/0068* (2013.01); *G01R 31/66* (2020.01)
(58) Field of Classification Search
CPC ...... H02J 7/0032; H02J 7/0047; H02J 7/0068; G01R 3/66
See application file for complete search history.

(56) References Cited

U.S. PATENT DOCUMENTS

| 11,506,715 | B2 * | 11/2022 | Song | G01R 31/3277 |
| 11,515,719 | B2 * | 11/2022 | Kim | G01R 31/3277 |
| 2013/0229186 | A1 * | 9/2013 | Shiraishi | G01R 31/3277 |
| | | | | 324/415 |

FOREIGN PATENT DOCUMENTS

| CN | 106569128 A | 4/2017 |
| CN | 209765017 U | 12/2019 |
| CN | 111913132 A | 11/2020 |

* cited by examiner

*Primary Examiner* — Jared Fureman
*Assistant Examiner* — Duc M Pham
(74) *Attorney, Agent, or Firm* — IPro, PLLC

(57) ABSTRACT

A switch detection circuit includes a controller, a first DC isolation module, a second DC isolation module, and a signal conditioning module connected to the controller. The controller is connected to a first end of an external switch via the first DC isolation module and the signal conditioning module is connected to a second end of the external switch via the second DC isolation module. The controller is configured to output a pulse signal, and transmit the pulse signal to the second DC isolation module via the first DC isolation module and the external switch. As a current flowing out from the second DC isolation module, the signal conditioning module outputs a feedback signal to the controller and the controller counts according to the feedback signal and detects the working state of the external switch according to the count value.

9 Claims, 4 Drawing Sheets

SWITCH DETECTION CIRCUIT, METHOD, AND SWITCH DETECTOR

PRIORITY CLAIM

This application claims the benefit of and priority to the Chinese Patent Application No. 202210165686.4, filed to the Chinese patent office on Feb. 23, 2022 and entitled " Switch Detection Circuit, Method and Switch Detector" , which is hereby incorporated by reference in its entirety.

TECHNICAL FIELD

The present application relates to the field of new energy battery energy storage systems, and in particular to a switch detection circuit, method, and switch detector.

BACKGROUND

In a new energy battery energy storage system, a battery management system (BMS) usually has a switch on-off detection function, for example, for detecting whether a high-voltage connector has been reliably plugged, whether a door access switch has been closed, etc.

The existing detection methods require a set of an isolated power supply, an isolated optical coupler, or a digital isolator to detect the state of a switch, while the cost of providing the isolated power supply, the isolated optical coupler, or the digital isolator is relatively high. Therefore, the existing technology needs to be further improved.

SUMMARY

One technical solution adopted by the embodiments of the present application is to disclose a switch detection circuit including a controller, a first DC isolation module, a second DC isolation module, and a signal conditioning module;

an output end of the controller is connected to a first end of an external switch via the first DC isolation module, a control end of the signal conditioning module is connected to a second end of the external switch via the second DC isolation module, and an output end of the signal conditioning module is connected to an input end of the controller;

the output end of the controller is configured to output a pulse signal, and transmit the pulse signal to the second DC isolation module via the first DC isolation module and the external switch; and the signal conditioning module is configured to output a feedback signal to the input end of the controller according to an electrical signal output by the second DC isolation module, and the controller is also configured to count the received feedback signal to obtain a count value, and detect a working state of the external switch according to the count value.

Optionally, the first DC isolation module is a capacitor C1, the second DC isolation module is a capacitor C2; and a first end of the capacitor C1 is connected to the output end of the controller, and a second end of the capacitor C1 is connected to the first end of the external switch; the second end of the external switch is connected to a first end of the capacitor C2, and a second end of the capacitor C2 is connected to the control end of the signal conditioning module.

Optionally, the switch detection circuit further includes a resistor R1 and a resistor R3; and a first end of the resistor R1 is connected to the output end of the controller, and a second end of the resistor R1 is connected to the first end of the capacitor C1; a first end of the resistor R3 is connected to the second end of the capacitor C2, and a second end of the resistor R3 is configured to be grounded.

Optionally, a voltage detection end of the controller is connected to the second end of the resistor R1; and the controller is configured to detect a sampled voltage at the second end of the resistor R1 at rising edge of the pulse signal and determine whether the external switch has a fault based on the sampled voltage and the count value.

Optionally, the signal conditioning module includes a switch tube Q1 and a resistor R2; and a control end of the switch tube Q1 is connected to the second end of the capacitor C2, and a first end of the switch tube Q1 is connected to the input end of the controller and a second end of the resistor R2; a second end of the switch tube Q1 is configured to be grounded, and a first end of the resistor R2 is configured to be connected to a power supply.

One technical solution adopted by the embodiments of the present application is to disclose a switch detection method applied to the switch detection circuit. The method includes:

outputting a pulse signal, and successively passing the pulse signal through the first DC isolation module, an external switch, and the second DC isolation module, so that the signal conditioning module outputs a feedback signal according to an electrical signal output by the second DC isolation module;

receiving the feedback signal and counting the feedback signal to obtain a count value; and detecting a working state of the external switch according to the count value.

Optionally, the switch detection method further includes:

acquiring a sampled voltage at rising edge of the pulse signal; and determining whether the external switch has a fault according to the sampled voltage and the state of the external switch.

Optionally, the step of determining whether the external switch has a fault based on the sampled voltage and the working state of the external switch includes:

calculating a resistance value of the external switch according to the sampled voltage; and determining whether the external switch has a fault according to the calculated resistance value and the working state of the external switch.

Optionally, the calculation formula of the resistance value Rex of the external switch is as follow:

$$R_{ex} = \frac{U \times R_1 + (U - U_0) \times R_3}{U_0 - U}$$

wherein U is the sampled voltage, $U_0$ is the voltage value of the pulse signal, $R_1$ is the resistance value of the resistor R1, and $R_3$ is the resistance value of the resistor R3.

One technical solution adopted by the embodiments of the present application is to disclose a switch detector including the switch detection circuit as described above and/or a switch detector uses the switch detection method as described above to detect an external switch.

BRIEF DESCRIPTION OF THE DRAWINGS

One or more embodiments are illustrated by way of example in the accompanying drawings, which are not to be construed as limiting the embodiments, in which elements having the same reference numeral designations represent similar elements, and in which the figures are not to scale unless otherwise specified.

DETAILED DESCRIPTION

In order that the objects, aspects, and advantages of the present application will become more apparent, the present application will be further described in detail with reference to the accompanying drawings and embodiments. It should be understood that the specific embodiments described herein are illustrative only and are not limiting.

It will be appreciated that various features of the embodiments of the present invention can be combined with one another without departing from the scope of the invention. In addition, although the functional modules are divided in the schematic diagram of the apparatus, and the logical sequence is shown in the flowchart, in some cases, the division of the modules may be different from that in the schematic diagram of the apparatus, or the sequence may be performed differently from that shown or described in the flowchart.

Unless defined otherwise, all technical and scientific terms used herein have the same meaning as commonly understood by one of ordinary skill in the art to which the present invention belongs. The terminology used in the description of the application herein is for the purpose of describing particular embodiments only and is not intended to limit the present application. As used herein, the term "and/or" includes any and all combinations of one or more of the associated listed items.

Figure 1:
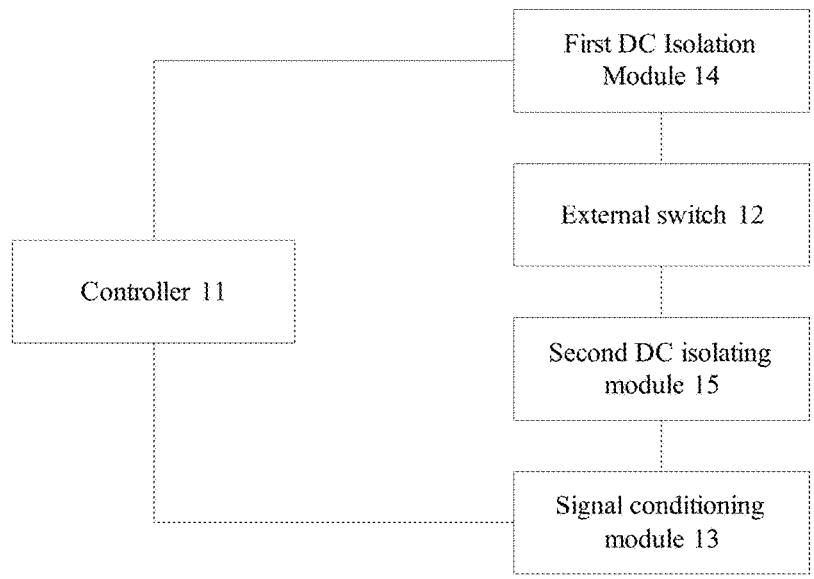
FIG. 1 is a structural block diagram of a switch detection circuit according to an embodiment of the present application.

Reference is made to FIG. 1, which is a structural block diagram of a switch detection circuit according to an embodiment of the present application. As shown in FIG. 1, the switch detection circuit includes a controller 11, an external switch 12, a first direct current (DC) isolation module 14, a second DC isolation module 15, and a signal conditioning module 13, wherein the controller 11 includes an input end, an output end, and a voltage detection end.

Specifically, an output end of the controller 11 is connected to a first end of the external switch 12 via the first DC isolation module 14. A control end of the signal conditioning module 13 is connected to a second end of the external switch 12 via the second DC isolation module 15. An output end of the signal conditioning module 13 is connected to an input end of the controller 11.

The output end of the controller 11 is configured to output a pulse signal, and transmit the pulse signal to the second DC isolation module 15 via the first DC isolation module 14 and the external switch 12. Specifically, the pulse signal refers to an electrical signal continuously emitted according to a certain voltage amplitude and time interval. The pulse signal includes but is not limited to a square wave signal, and the square wave signal outputs high and low levels at intervals, wherein, the square wave signal has rising edges and falling edges because of the jumping between high and low level in the square wave signal.

The first DC isolation module 14 and the second DC isolation module 15 both have the property of passing alternating current (AC) and blocking DC, namely, the first DC isolation module 14 and the second DC isolation module 15 are both configured to pass AC and block DC. Specifically, the first DC isolation module 14 and the second DC isolation module 15 are also configured to isolate DC connected to the external switch 12, so as to prevent the power supply connected to the external switch 12 from interfering with the detection result or damaging components in the detection circuit. The current transmitted by the first DC isolation module 14 varies according to the height of the pulse signal. When the pulse signal is at a rising edge, since the first DC isolation module 14 has the characteristics of passing AC and blocking DC, and passing high frequency and blocking low frequency, the first DC isolation module 14 is equivalent to a conductive wire. The pulse signal flows into the external switch 12 via the first DC isolation module 14. When the external switch 12 is turned on, the pulse signal will flow into the second DC isolation module 15 through the first DC isolation module 14. At this moment, the level of the second DC isolation module 15 jumps, and the second DC isolation module 15 is equivalent to a conductive wire so that the pulse signal flows out from the first DC isolation module 14 and is transmitted to a control end of the signal conditioning module 13 via the second DC isolation module 15. When the pulse signal continuously outputs the high-level signal to the first DC isolation module 14, the first DC isolation module 14 starts charging. At this moment, if the external switch 12 is turned on, the first DC isolation module 14 and the second DC isolation module 15 are equivalent to energy storage devices, and no current flows out from the first DC isolation module 14 and the second DC isolation module 15. When the pulse signal is at a falling edge or a low-level signal, the first DC isolation module 14 is in an open circuit state, no current flows out in the first DC isolation module 14, and in turn, no current is transmitted to the signal conditioning module 13 via the second DC isolation module 15 regardless of the working state of the external switch 12. Note that, in the present embodiment, the electrical signal output by the second DC isolation module 15 is a current signal actually output by the second DC isolation module 15 when the controller outputs a pulse signal.

Figure 3:
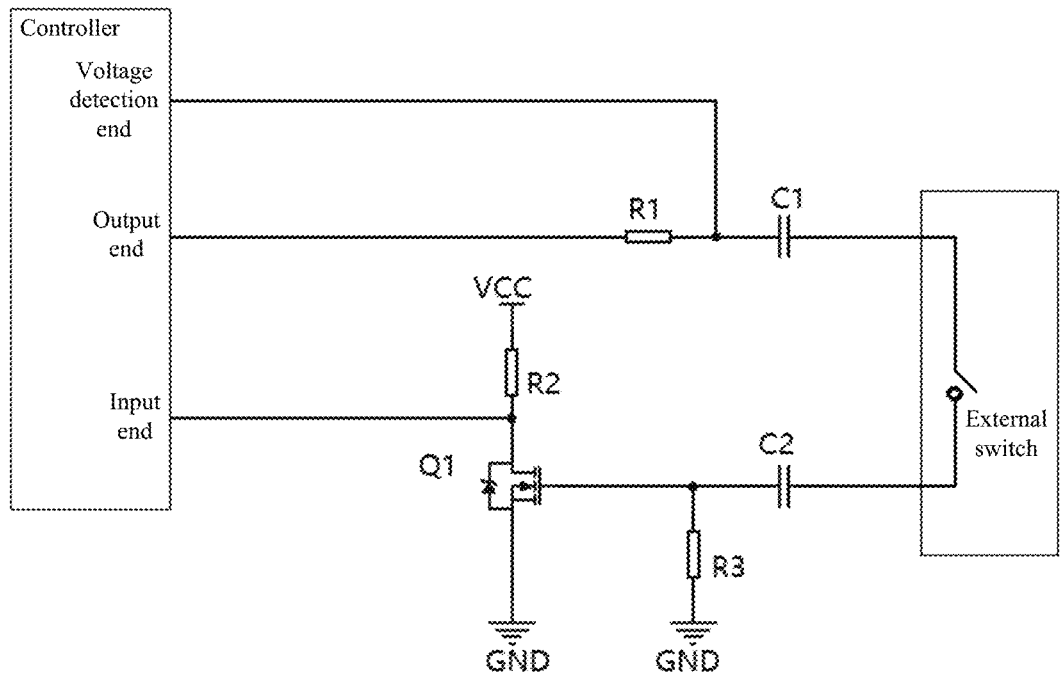
FIG. 3 is a circuit diagram of a switch detection circuit according to an embodiment of the present application.

As shown in FIG. 3, the first DC isolation module 14 is a capacitor C1, and the second DC isolation module 15 is a capacitor C2. A first end of the capacitor C1 is connected to the output end of the controller 11, and a second end of the capacitor C1 is connected to the first end of the external switch 12. The second end of the external switch 12 is connected to a first end of the capacitor C2, and a second end of the capacitor C2 is connected to the control end of the signal conditioning module 13.

Specifically, the capacitor C1 and capacitor C2 are isolation capacitors, and have the functions of passing AC and blocking DC, and passing high frequency and blocking low frequency. Under a high-frequency signal, the capacitors C1 and C2 exhibit a low impedance characteristic, that is to say, when a pulse signal output by the output end of the controller 11 is at a rising edge, the capacitor C1 exhibits the low impedance characteristic, and the pulse signal can directly flow out through the capacitor C1. When the external switch 12 is turned on, the pulse signal flows into the capacitor C2 through the external switch 12, and the capacitor C2 also has a current flowing out. If the external switch 12 is in an off state, no current flows out of the capacitor C2. When the output end of the controller 11 continuously outputs a high-level signal, the pulse signal flows into the capacitor C1 to start charging the capacitor C1, and no current flows out from the capacitor C1. At this moment, no current exists in the capacitor C2 regardless of whether the external switch 12 is turned on. When the output end of the controller 11 is a falling edge or a continuous low-level signal, the capacitor has a high impedance characteristic. The pulse signal is isolated by the capacitor C, so no current flows out of the capacitor C. At this moment, no current exists in the capacitor C2 regardless of whether the external switch 12 is turned on. Note that in an energy storage power supply, the external switch is usually connected to a DC power supply provided by a battery. A switch on/off detection circuit provided in the present application can effectively isolate the DC power supply connected to the external switch by providing capacitors C and C2, so as to avoid the DC power supply interfering with the detection result, and better protect the detection circuit.

The signal conditioning module 13 is configured to output a feedback signal to the input end of the controller 11 according to the electrical signal output by the second DC isolation module 15. The controller 11 is also configured to count the received feedback signal to obtain a count value, and detect the working state of the external switch 12 according to the count value.

Figure 2:
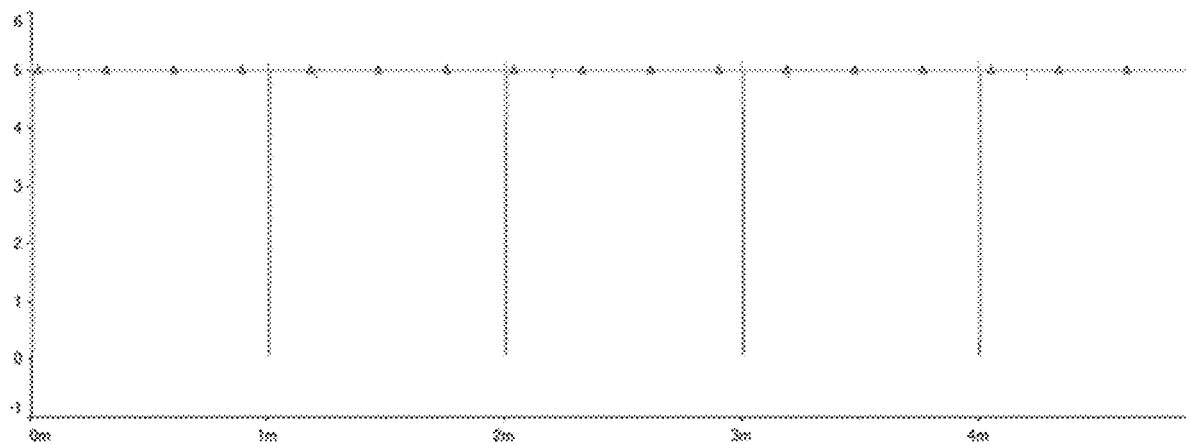
FIG. 2 is a schematic diagram of pulse counting in a switch detection circuit according to an embodiment of the present application.

Specifically, when a current flows out from the second DC isolation module 15, the current directly flows into the control end of the signal conditioning module 13 so as to control the signal conditioning module 13 to be turned on. At this moment, the input end of the controller 11 is connected to a ground end, namely, the input end of the controller 11 receives a low-level signal. When no current flows out in the second DC isolation module 15, the signal conditioning module 13 is in a cut-off state, and the input end of the controller 11 is connected to the power supply via the signal conditioning module 13, namely, the input end of the controller 11 receives the high-level signal. Reference is made to FIG. 2, which is a schematic diagram of pulse counting in a switch detection circuit according to an embodiment of the present application. The vertical axis of the pulse count is the voltage value of the pulse signal and the horizontal axis is time. The counting refers to counting the number of times a low-level signal is received at the input end of the controller 11 over a period of time. Specifically, the selected time period is any time period for outputting pulse signals, and the specific time period can be set by a user according to requirements.

As shown in FIG. 3, the signal conditioning module 13 includes a switch tube Q1 and a resistor R2. A control end of the switch tube Q1 is connected to a second end of the capacitor C2. A first end of the switch tube Q1 is connected to the input end of the controller 11 and a second end of the resistor R2. A second end of the switch tube Q1 is configured to be grounded. A first end of the resistor R2 is configured to be connected to a power supply.

Specifically, when a current flows out of the capacitor C2, the current flows into the control end of the switch tube Q1, and in turn, the switch tube Q1 is turned on. The input end of the controller 11 is grounded via the switch tube Q1 so as to receive a low-level signal. When no current flows out of the capacitor C2, the switch Q1 is in a cut-off state, and the input end of the controller 11 is connected to the power supply via the resistor R2 so as to receive a high-level signal.

In some embodiments, the controller 11 is configured to judge whether the count value is greater than a preset count threshold value. When the count value is greater than the preset count threshold value, it is judged that the external switch 12 is in an on state, and when the count value is less than the preset count threshold value, it is judged that the external switch 12 is in an off state. In this way, detection of the switch state can be achieved, and the introduction of a preset count threshold value can reduce misjudgment. Further, the controller 11 is configured to count according to the number of low-level signals received at its input end, record the count value, and compare the count value with the size of a preset threshold value. Note that the preset count threshold is related to the number of pulses of the output pulse signal, and the preset count threshold value is equal to or slightly smaller than the number of pulses of the pulse signal. Normally, when the external switch 12 is normally turned on, the number of pulses output by the output end of the controller 11 in a period of time is equal to the number of low levels received by the input end of the controller 11, wherein the number of pulses can be understood as the number of rising edges of the pulse signal, and the number of low levels received can be understood as the count value. The preset count threshold value is used as a determination basis, which can improve the accuracy of on/off detection of the switch and reduce misjudgment.

In some embodiments, the switch detection circuit may also determine whether the external switch 12 has a fault by detecting the resistance value of the external switch 12. Specifically, reference is made to FIG. 3, which is a circuit diagram of a switch detection circuit according to an embodiment of the present application. As shown in FIG. 3, the switch detection circuit further includes a resistor R1 and a resistor R3. A first end of the resistor R1 is connected to the output end of the controller 11, and a second end of the resistor R1 is respectively connected to the first end of the capacitor C1 and a voltage detection end of the controller 11. A first end of the resistor R3 is connected to the second end of the capacitor C2, and a second end of the resistor R3 is configured to be grounded.

Specifically, when the rising edge of the pulse signal is output at the output end of the controller 11, the sampled voltage across the second end of the resistor R1, i.e. the sum of the resistor R3 and the voltage on the external switch 12, is detected through the voltage detection end of the controller 11. Then whether the external switch 12 has a fault is determined through the sampled voltage and the count value. Wherein when a pulse signal output at the output end of the controller 11 is at the rising edge, the sum of voltages across the external switch 12 and the resistor R3 is collected. Then the resistance value on the external switch 12 is calculated according to the sum of the voltages. Whether the external switch 12 has a fault is determined according to the size of the resistance value.

An embodiment of the present application discloses a switch detection circuit, wherein the switch detection circuit includes a controller, a first DC isolation module, a second DC isolation module and a signal conditioning module. An output end of the controller is connected to a first end of the external switch via the first DC isolation module. A control end of the signal conditioning module is connected to a second end of the external switch via the second DC isolation module. An output end of the signal conditioning module is connected to the input end of the controller. The output end of the controller is configured to output a pulse signal, and transmit the pulse signal to the second DC isolation module via the first DC isolation module and the external switch; at this moment, if a current flows out from the second DC isolation module, the control end of the signal conditioning module outputs a feedback signal to the input end of the controller after receiving the current, and the controller counts according to the feedback signal and detects the working state of the external switch according to the count value, so that the on/off of the external switch can be detected without using an optical coupling DC isolation module, thus reducing the circuit detection cost.

Figure 4:
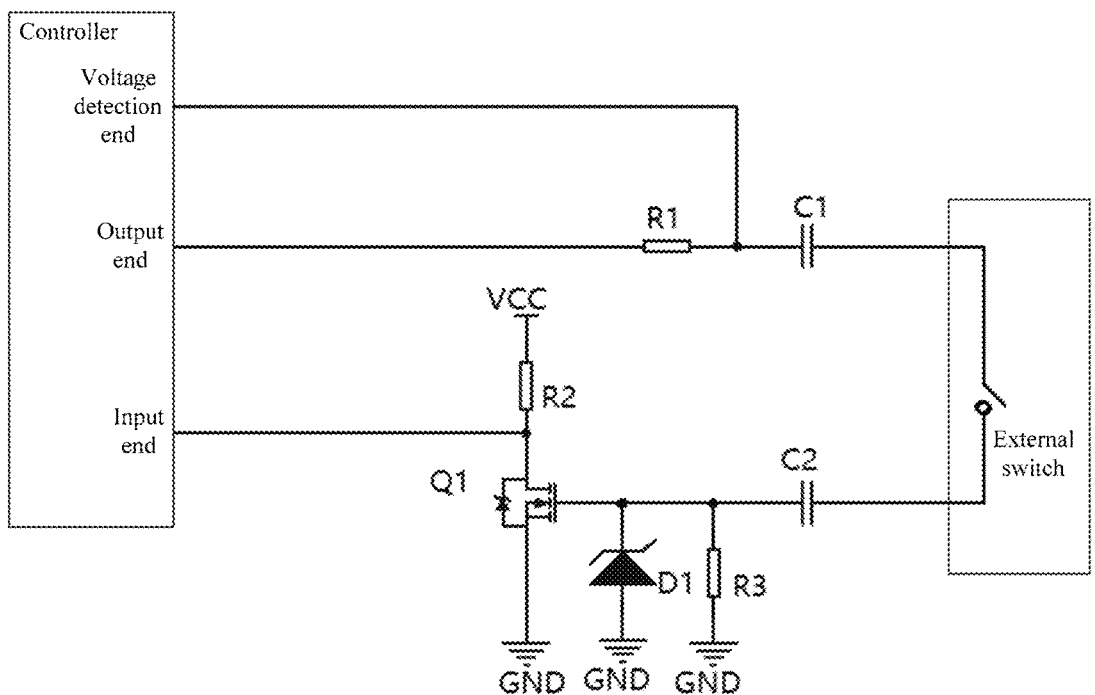
FIG. 4 is a circuit diagram of another switch detection circuit according to an embodiment of the present application.

In some embodiments, reference is made to FIG. 4, which is a circuit diagram of another switch detection circuit according to an embodiment of the present application. As shown in FIG. 4, when a first end of the external switch is connected to a DC power supply, the switch detection circuit further includes a Zener diode D1. A cathode of the Zener diode D1 is connected to the control end of the switch tube Q1, and an anode of the Zener diode D1 is configured to be grounded. Specifically, when the first end of the external switch 12 is connected to a DC power supply, since the capacitor C2 has the characteristics of passing AC and blocking DC and passing high frequency and blocking low frequency, the capacitor C2 is equivalent to a conductive wire at the moment when the external switch 12 is closed. At this moment, no matter whether the external switch 12 has a fault or not, a current in the DC power supply will flow into a control end of the switch tube Q1 to control the on/off of switch tube Q1, so that the input end of the controller 11 receives a feedback signal, and the controller 11 generates a misjudgment. Therefore, by connecting a Zener diode D1 at the control end of the switch tube Q1, the current in the DC power supply can directly flow out through the Zener diode D1 at the moment when the external switch 12 is closed, thereby avoiding misjudgment.

Figure 5:
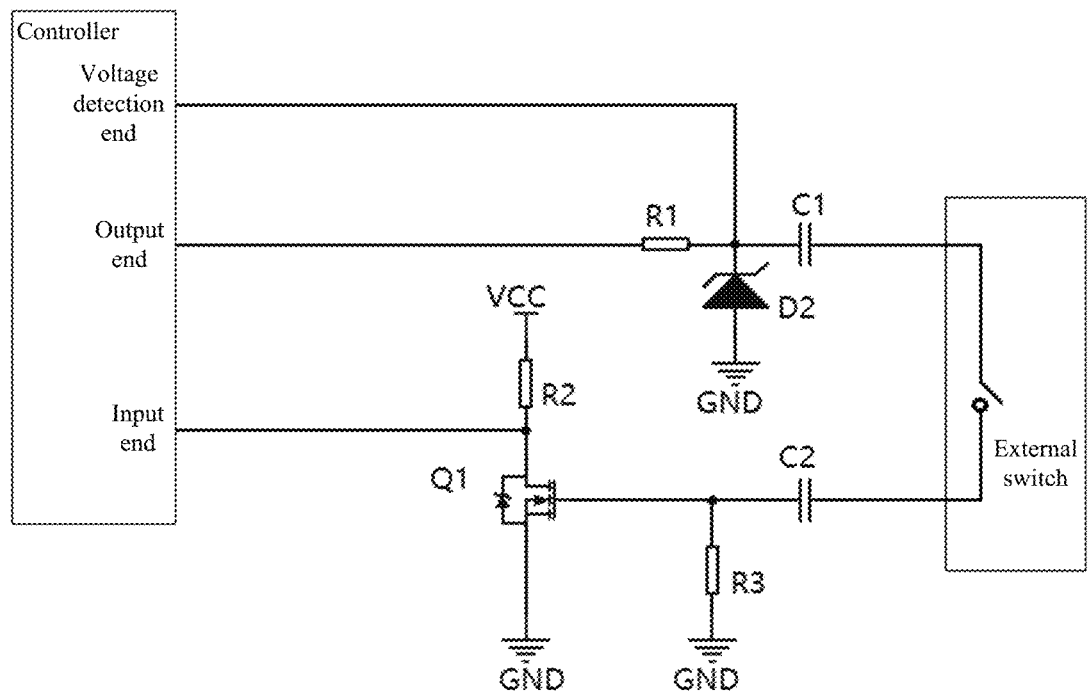
FIG. 5 is a circuit diagram of another switch detection circuit according to an embodiment of the present application.

In another embodiment, reference is made to FIG. 5, which is a circuit diagram of another switch detection circuit according to an embodiment of the present application. As shown in FIG. 5, when a second end of the external switch is connected to a DC power supply, the switch detection circuit further includes a Zener diode D2. A cathode of the Zener diode D2 is connected to a second end of the resistor R1, and an anode of the Zener diode D2 is configured to be grounded. Specifically, when the second end of the external switch 12 is connected to a DC power supply, since the capacitor C1 has the characteristics of passing AC and blocking DC and passing high frequency and blocking low frequency, the capacitor C1 is equivalent to a conductive wire at the moment when the external switch 12 is closed. At this moment, the current in the DC power supply will directly flow into the output end of the controller. Therefore, by connecting a Zener diode D2 at the second end of the resistor R1, the current in the DC power supply can flow out through the Zener diode D2 at the moment when the external switch 12 is closed.

Figure 6:
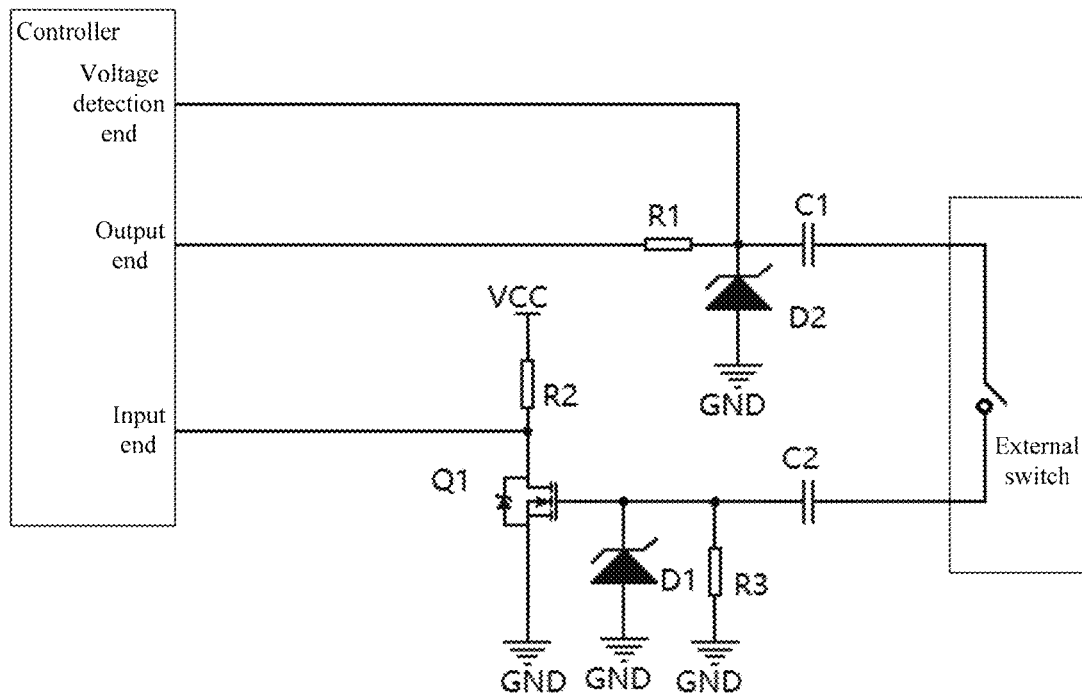
FIG. 6 is a circuit diagram of yet another switch detection circuit according to an embodiment of the present application.

In yet another embodiment, reference is made to FIG. 6, which is a circuit diagram of yet another switch detection circuit according to an embodiment of the present application. As shown in FIG. 6, the switch detection circuit further includes Zener diodes D1 and D2. Wherein a cathode of the Zener diode D1 is connected to the control end of the switch tube Q1, an anode of the Zener diode D1 is configured to be grounded. A cathode of the Zener diode D2 is connected to the second end of the resistor R1, and an anode of the Zener diode D2 is configured to be grounded. Specifically, when the external switch 12 is connected to a DC power supply, the capacitor C1 and the capacitor C2 are equivalent to conductive wires at the moment when the external switch 12 is closed. At this moment, a second end of the resistor R1 is connected to the Zener diode D2 and the control end of the switch tube Q1 is connected to the Zener diode D1, so that the current in the DC power supply can directly flow out through the Zener diode, thereby avoiding misjudgment.

Figure 7:
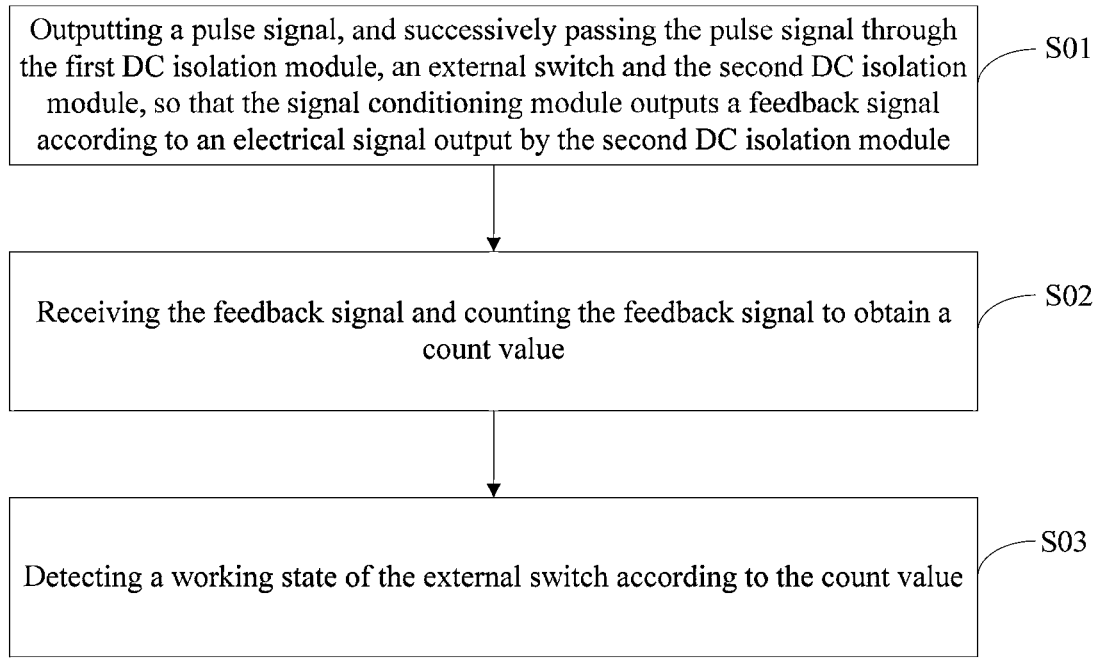
FIG. 7 is a flowchart of a switch detection method according to an embodiment of the present application.

Reference is made to FIG. 7, which is a flowchart of a switch detection method according to an embodiment of the present application, wherein the switch detection method is applied to the above-mentioned switch detection circuit. As shown in FIG. 7, the switch detection method includes the following steps:

S01, outputting a pulse signal and successively passing the pulse signal through the first DC isolation module, the external switch and the second DC isolation module, so that the signal conditioning module outputs a feedback signal according to the electrical signal output by the second DC isolation module.

Specifically, the pulse signal is periodically outputted through the output end of the controller. The pulse signal refers to an electrical signal continuously emitted according to a certain voltage amplitude and time interval. The pulse signal includes but is not limited to a square wave signal, and the square wave signal outputs high and low levels at intervals, wherein, the square wave signal has rising edges and falling edges because of the jumping between the high and low level in the square wave signal. Wherein the current in the first DC isolation module and the second DC isolation module change according to the level of the pulse signal. When the pulse signal is at a rising edge, the first DC isolation module is in a short-circuit state, equivalent to a conductive wire. At this moment, if the external switch is in an on-state, the pulse signal flows out to a control end of the signal conditioning module via the first DC isolation module, the external switch, and the second DC isolation module. When the pulse signal is at a high level, the first DC isolation module starts charging. At this moment, if the external switch is in an on-state, the first DC isolation module and the second DC isolation module are equivalent to energy storage devices, and no current flows out from the first DC isolation module and the second DC isolation module. When the pulse signal is at a falling edge or a low-level signal, the first DC isolation module and the second DC isolation module are in an open circuit state, and no current flows out in the first DC isolation module and the second DC isolation module.

Specifically, when a current flows out from the second DC isolation module, the current directly flows into the control end of the signal conditioning module so as to control the signal conditioning module to be turned on. At this moment, the input end of the controller is connected to a ground end through the signal conditioning module, namely, the input end of the controller receives a low-level signal. When no current flows out in the second DC isolation module, the signal conditioning module is in a cut-off state, and the input end of the controller is connected to the power supply via the signal conditioning module, namely, the input end of the controller receives the high-level signal.

S02, receiving the feedback signal and counting the feedback signal to obtain a count value.

Specifically, the feedback signal means that the received level signal jumps from a low level to a high level, namely, if the input end of the controller receives a low-level signal and then receives a high-level signal, the controller performs counting. Reference is made to FIG. 2, which is a schematic diagram of pulse counting in a switch detection circuit according to an embodiment of the present application. The counting refers to counting the number of times a low-level signal is received at the input end of the controller over a period of time. Specifically, the selected time period is any time period for outputting pulse signals, and the specific time period can be set by a user according to requirements.

S03. detecting a working state of the external switch according to the count value.

Specifically, the controller counts according to the jump of the level signal, records the count value and compares the size of the count value with a preset threshold value. Wherein when the count value is greater than the preset count threshold value, it is judged that the external switch is in an on state, and when the count value is less than the preset count threshold value, it is judged that the external switch is in an off state. In this way, detection of the switch state can be achieved, and the introduction of a preset count threshold value can reduce misjudgment.

Figure 8:
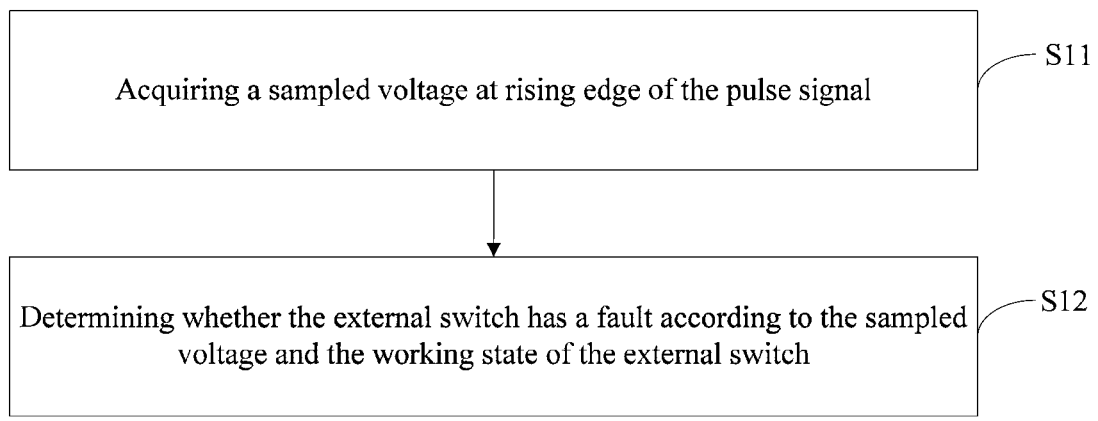
FIG. 8 is a flowchart of external switch fault detection in a switch detection method according to an embodiment of the present application.

In some embodiments, the switch detection method further includes determining whether the external switch has a fault. Reference is made to FIG. 8, which is a flowchart of external switch fault detection in a switch detection method according to an embodiment of the present application. As shown in FIG. 8, the switch detection method includes:

S11 acquiring a sampled voltage at rising edge of the pulse signal.

Specifically, the sampled voltage refers to the voltage collected at the voltage detection terminal of the controller when the rising edge of the pulse signal is output at the output end of the controller, that is, the sum of the voltage of the external switch and the voltage of the resistor R3.

In some embodiments, the acquisition mode of the sampled voltage may also include: acquiring a voltage value across the resistor R1, then acquiring the voltage value of the pulse signal, subtracting the voltage value of the resistor R1 from the voltage value of the pulse signal to obtain a difference, i.e. the voltage value of the sampled voltage.

S12, determining whether the external switch has a fault according to the sampled voltage and the working state of the external switch.

Specifically, the resistance value of the external switch is calculated according to the sampled voltage. The calculation formula of the resistance value Rex of the external switch is as follow:

$$R_{ex} = \frac{U \times R_1 + (U - U_0) \times R_3}{U_0 - U};$$

where U is the sampled voltage, $U_0$ is the voltage value of the pulse signal, $R_1$ is the resistance value of the resistor R1, and $R_3$ is the resistance value of the resistor R3.

After calculating the resistance value of the external switch, whether the external switch has a fault is determined according to the resistance value of the external switch and the working state of the external switch.

Specifically, whether the external switch is in an on-state or an off-state is judged according to the count value of the controller.

When the external switch is in an on-state, the resistance value of the external switch is calculated and the magnitude of the resistance value of the external switch is judged. If the resistance value of the external switch is less than a first preset resistance value, then the external switch is in a normally conductive state; and if the resistance value of the external switch is greater than the first preset resistance value and less than a second preset resistance value, then the external switch is in a fault conductive state. When the external switch is in a cut-off state, the resistance value of the external switch is calculated and the magnitude of the resistance value of the external switch is judged. If the resistance value of the external switch is greater than the second preset resistance value, then the external switch is in a normal cut-off or fault cut-off or a second end short-circuit cut-off state. If the sampled voltage gradually rises to the pulse signal voltage value, the external switch is in a first end short-circuit cut-off state and/or a first end short-circuit conductive state and/or a second end short-circuit conductive state. Alternatively, the first preset resistance value may be set to zero and the second preset resistance value may be set to infinity.

The embodiment of the present application discloses a switch detection method, which includes: outputting a pulse signal, and sequentially passing the pulse signal through the first DC isolation module, the external switch, and the second DC isolation module, so that the signal conditioning module outputs a feedback signal according to the electrical signal output by the second DC isolation module, then counting according to the signal fed back by the signal conditioning module to obtain a count value, and finally detecting the working state of the external switch according to the count value. Thus, in the case of not using an optical coupling DC isolation module, the on/off condition of the external switch is judged by the count value, reducing the detection cost of the circuit.

It should be noted that in the above-mentioned various embodiments, there is not necessarily a certain order between the above-mentioned various steps. A person of ordinary skill in the art would have been able to understand according to the description of the embodiments of the present application that in different embodiments, the above-mentioned various steps can be performed in a different order, namely, can be performed in parallel, can be performed in exchange, etc.

Embodiments of the present application also discloses a switch detector including the above-mentioned switch detection circuit and/or switch detection method. The switch detector outputs a pulse signal via an output end of a controller, then an input end of the controller receives a feedback signal and counts. The on/off of the switch can be judged via the count value, thereby avoiding the use of an optical coupling DC isolation module for detection, reducing the cost of the circuit. Further, the resistance value of the switch is detected via a voltage detection end of the controller, so that the switch detector can judge whether the switch has a fault while detecting the on/off of the switch.

Finally, it should be noted that the above embodiments are merely illustrative of the technical solutions of the present application, rather than limiting it. Combinations of features in the above embodiments or in different embodiments are also possible within the spirit of the application. The steps can be implemented in any order. There are many other variations of the different aspects of the present application described above, which are not provided in detail for the sake of brevity. Although the present application has been described in detail with reference to the foregoing embodiments, those skilled in the art will appreciate that the technical solutions disclosed in the above-mentioned embodiments can still be amended, or some of the technical features thereof can be replaced by equivalents. However, these modifications or substitutions do not bring the essence of the corresponding technical solutions out of the scope of the technical solutions of the various embodiments of the present application.

What is claimed is:

1. A switch detection circuit, comprising a controller, a first DC isolation module, a second DC isolation module and a signal conditioning module;

wherein an output end of the controller is connected to a first end of an external switch via the first DC isolation module, a control end of the signal conditioning module is connected to a second end of the external switch via the second DC isolation module, and an output end of the signal conditioning module is connected to an input end of the controller;

the output end of the controller is configured to output a pulse signal, and transmit the pulse signal to the second DC isolation module via the first DC isolation module and the external switch; and the signal conditioning module is configured to output a feedback signal to the input end of the controller according to an electrical signal output by the second DC isolation module, and the controller is also configured to count the received feedback signal to obtain a count value, and detect a working state of the external switch according to the count value;

wherein the first DC isolation module is a capacitor C1, the second DC isolation module is a capacitor C2 and the switch detection circuit further comprises a resistor R1 and a resistor R3;

wherein a first end of the resistor R1 is connected to the output end of the controller, and a second end of the resistor R1 is connected to the first end of the capacitor C1; a first end of the resistor R3 is connected to the second end of the capacitor C2, and a second end of the resistor R3 is configured to be grounded;

wherein a voltage detection end of the controller is connected to the second end of the resistor R1; and the controller is configured to detect a sampled voltage of the second end of the resistor R1 at rising edge of the pulse signal, and determine whether the external switch has a fault according to the sampled voltage and the count value.

2. The switch detection circuit according to claim 1, wherein a first end of the capacitor C1 is connected to the output end of the controller, and a second end of the capacitor C1 is connected to the first end of the external switch; the second end of the external switch is connected to a first end of the capacitor C2, and a second end of the capacitor C2 is connected to the control end of the signal conditioning module.

3. The switch detection circuit according to claim 2, wherein the signal conditioning module comprises a switch tube Q1 and a resistor R2; and a control end of the switch tube Q1 is connected to the second end of the capacitor C2, and a first end of the switch tube Q1 is connected to the input end of controller and a second end of the resistor R2; a second end of the switch tube Q1 is configured to be grounded, and a first end of the resistor R2 is configured to be connected to a power supply.

4. A switch detector, wherein the switch detector comprises the switch detection circuit according to claim 3.

5. A switch detector, wherein the switch detector comprises the switch detection circuit according to claim 2.

6. A switch detector, wherein the switch detector comprises the switch detection circuit according to claim 1.

7. A switch detection method applied to the switch detection circuit according to claim 1, wherein the switch detection method comprises:

outputting a pulse signal, and successively passing the pulse signal through the first DC isolation module, an external switch, and the second DC isolation module, so that the signal conditioning module outputs a feedback signal according to an electrical signal output by the second DC isolation module;

receiving the feedback signal and counting the feedback signal to obtain a count value; and detecting a working state of the external switch according to the count value; acquiring a sampled voltage at rising edge of the pulse signal; and determining whether the external switch has a fault according to the sampled voltage and the working state of the external switch.

8. The switch detection method according to claim 7, wherein the step of determining whether the external switch has a fault according to the sampled voltage and the working state of the external switch comprises:

calculating a resistance value of the external switch according to the sampled voltage; and determining whether the external switch has a fault according to the calculated resistance value and the working state of the external switch.

9. The switch detection method according to claim 8, wherein a calculation formula of the resistance value $R_{ex}$ of the external switch is as follow:

$$R_{ex} = \frac{U \times R_1 + (U - U_0) \times R_3}{U_0 - U};$$

wherein U is the sampled voltage, $U_0$ is the voltage value of the pulse signal, $R_1$ is the resistance value of the resistor R1, and $R_3$ is the resistance value of the resistor R3.

* * * * *